United States Patent
Frougier et al.

(10) Patent No.: US 12,477,779 B2
(45) Date of Patent: Nov. 18, 2025

(54) GATE-ALL-AROUND FIELD-EFFECT-TRANSISTOR WITH WRAP-AROUND-CHANNEL INNER SPACER

(71) Applicant: INTERNATIONAL BUSINESS MACHINES CORPORATION, Armonk, NY (US)

(72) Inventors: Julien Frougier, Albany, NY (US); Andrew M. Greene, Slingerlands, NY (US); Ruilong Xie, Niskayuna, NY (US); Kangguo Cheng, Schenectady, NY (US); Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 814 days.

(21) Appl. No.: 17/550,658

(22) Filed: Dec. 14, 2021

(65) Prior Publication Data

US 2023/0187516 A1 Jun. 15, 2023

(51) Int. Cl.
*H10D 30/67* (2025.01)
*H10D 62/10* (2025.01)
*H10D 64/01* (2025.01)
*H10D 64/23* (2025.01)

(52) U.S. Cl.
CPC ..... *H10D 30/6735* (2025.01); *H10D 30/6757* (2025.01); *H10D 62/118* (2025.01); *H10D 64/017* (2025.01); *H10D 64/018* (2025.01); *H10D 64/021* (2025.01); *H10D 64/258* (2025.01)

(58) Field of Classification Search
CPC .................................................. H10D 30/6735
See application file for complete search history.

(56) References Cited

U.S. PATENT DOCUMENTS

| | | | |
|---|---|---|---|
| 9,484,447 B2 * | 11/2016 | Kim | H10D 64/018 |
| 9,842,914 B1 | 12/2017 | Yeung et al. | |
| 10,014,390 B1 | 7/2018 | Bouche et al. | |
| 10,243,060 B2 | 3/2019 | Chao et al. | |
| 10,269,983 B2 | 4/2019 | Frougier et al. | |
| 10,332,963 B1 | 6/2019 | Xie | |
| 10,651,291 B2 | 5/2020 | Frougier et al. | |
| 10,692,991 B2 | 6/2020 | Chanemougame et al. | |

(Continued)

OTHER PUBLICATIONS

Kal et al., "Selective isotropic etching of Group IV semiconductors to enable gate all around device architectures", TEL Technology Center America, LLC, SPCC, Apr. 10, 2018, pp. 1-17.

(Continued)

*Primary Examiner* — Mounir S Amer
(74) *Attorney, Agent, or Firm* — Tutunjian & Bitetto, P.C.; L. Jeffrey Kelly

(57) ABSTRACT

A gate-all-around field effect transistor device is provided. The gate-all-around field effect transistor device includes one or more channel layers on a substrate. The gate-all-around field effect transistor device further includes an inner spacer wrapped around four sides of an end portion of each of the one or more channel layers. The gate-all-around field effect transistor device further includes a portion of an inner spacer liner between a portion of an upper most channel layer and a portion of an outer spacer.

13 Claims, 9 Drawing Sheets

(56) References Cited

U.S. PATENT DOCUMENTS

| | | | |
|---|---|---|---|
| 10,818,792 | B2 | 10/2020 | Frougier et al. |
| 10,903,315 | B2 | 1/2021 | Loubet et al. |
| 12,382,681 | B2 * | 8/2025 | Lee ............... H10D 62/118 |
| 2019/0252516 | A1 | 8/2019 | Cheng et al. |
| 2019/0393306 | A1 | 12/2019 | Zhang et al. |
| 2020/0066894 | A1 | 2/2020 | Frougier et al. |
| 2020/0083352 | A1 | 3/2020 | Chanemougame et al. |
| 2021/0020741 | A1 | 1/2021 | Wu et al. |
| 2021/0036119 | A1 | 2/2021 | Cheng et al. |
| 2021/0036122 | A1 * | 2/2021 | Wong ............... H01L 21/764 |
| 2021/0083090 | A1 | 3/2021 | Wang et al. |
| 2021/0126097 | A1 | 4/2021 | Ju et al. |

OTHER PUBLICATIONS

Loubet et al., "A Novel Dry Selective Etch of SiGe for the Enablement of High Performance Logic Stacked Gate-All-Around NanoSheet Devices", In 2019 IEEE International Electron Devices Meeting (IEDM) Dec. 7, 2019 (pp. 11-14). IEEE.

International Search Report issued in corresponding PCT Application Serial No. PCT/IB2022/061543 dated Mar. 27, 2023, 5 pgs.

Response to communication pursuant to Rule 161(1) and 162 EPC dated Dec. 20, 2024, Application No. 22835878.4, IBM Patent Reference, 6 pages.

\* cited by examiner

GATE-ALL-AROUND FIELD-EFFECT-TRANSISTOR WITH WRAP-AROUND-CHANNEL INNER SPACER

BACKGROUND

The present invention generally relates to inner spacers in gate-all-around (GAA) field effect transistor devices, and more particularly to inner spacers that wrap around individual channels in a gate-all-around field effect transistor device.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows from a source to a drain. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a gate-all-around field effect transistor device is provided. The gate-all-around field effect transistor device includes one or more channel layers on a substrate. The gate-all-around field effect transistor device further includes an inner spacer wrapped around four sides of an end portion of each of the one or more channel layers. The gate-all-around field effect transistor device further includes a portion of an inner spacer liner between a portion of an upper most channel layer and a portion of an outer spacer.

In accordance with another embodiment of the present invention, a gate-all-around field effect transistor device is provided. The gate-all-around field effect transistor device includes one or more channel layers on a substrate. The gate-all-around field effect transistor device further includes an inner spacer wrapped around four sides of an end portion of each of the one or more channel layers. The gate-all-around field effect transistor device further includes an inner spacer liner on three sides of a portion of the inner spacer and opposite sidewalls of each of the one or more channel layers, wherein the inner spacer liner is between a portion of an upper most channel layer and a portion of an outer spacer.

In accordance with another embodiment of the present invention, a method of forming a gate-all-around field effect transistor device is provided. The method of forming a gate-all-around field effect transistor device includes forming a dummy gate fill on a stack of alternating channel layers and sacrificial layers on a substrate. The method of forming a gate-all-around field effect transistor device further includes forming an inner spacer liner on the dummy gate fill and the top most layer of the stack. The method of forming a gate-all-around field effect transistor device further includes forming an outer spacer on the inner spacer liner. The method of forming a gate-all-around field effect transistor device further includes recessing the inner spacer liner. The method of forming a gate-all-around field effect transistor device further includes removing a portion of the sacrificial layers to form inner spacer cavities and sacrificial layer sections between the channel layers. The method of forming a gate-all-around field effect transistor device further includes forming an inner spacer around four sides of an end portion of each of the channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention can provide an inner spacer structure that addresses rounding and narrowing of the inner spacer adjacent to the outer spacer due to etching effects, which can create weak points at the inner spacer/outer spacer interfaces.

Embodiments of the present invention can provide an inner spacer liner adjoining the inner spacer and outer spacer at this interface. The inner spacer liner is intended as a sacrificial feature, where it is selectively and precisely recessed to expose the edge of the sacrificial layers in a stack before an inner spacer indentation process. The selective recess of the inner spacer liner exposes the edges of the sacrificial layers allowing a more uniform indent process in the regions against the outer spacer, thus preventing a rounded inner spacer profile into the region by the gate structure. This adjusts the inner spacer cavity towards a more uniform edge and idealistic squared profile. With formation of a wrap-around-channel inner spacer, the indent shape is more ideal against the outer spacer and sacrificial section leading to a thicker effective sealing of the inner spacer against the outer spacer that isolates the gate region from the source-drain regions. Gate length uniformity is also improved, so more consistent device performance can be obtained due to uniform gate lengths, and better isolation between conductive components can improve device yields.

In various embodiments, the inner spacer liner can be an L-shaped liner on the top most channel of the stack and the sidewalls of the dummy gate fill.

Embodiments of the present invention can provide an inner spacer that wraps around four (4) sides of the channel(s), where a portion of the inner spacer separates the outer spacer from the sides of the channels. In various embodiments, the channel(s) can be nanosheets, nano-ellipses, or nanowires.

Exemplary applications/uses to which the present invention can be applied include, but are not limited to: logic devices and memory devices.

It is to be understood that aspects of the present invention will be described in terms of a given illustrative architecture; however, other architectures, structures, substrate materials and process features and steps can be varied within the scope of aspects of the present invention.

Figure 1:
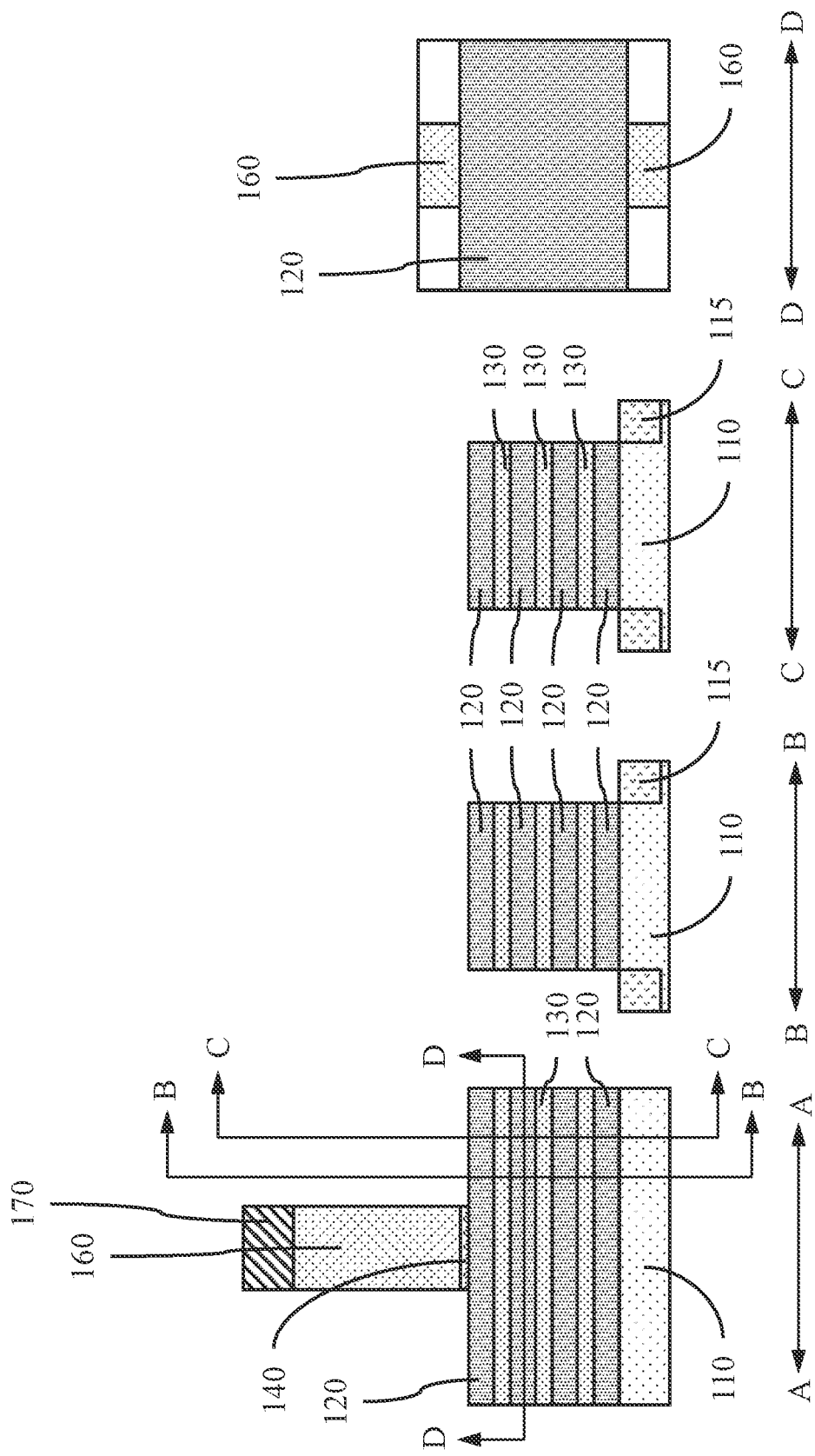
FIG. 1 illustrates multiple cross-sectional views showing a stack of alternating channel layers and sacrificial layers on a substrate, and a dummy gate structure on the stack, in accordance with an embodiment of the present invention.

Referring now to the drawings in which like numerals represent the same or similar elements and initially to FIG. 1, FIG. 1 illustrates multiple cross-sectional views showing a stack of alternating channel layers and sacrificial layers on a substrate, and a dummy gate structure on the stack, in accordance with an embodiment of the present invention.

In one or more embodiments, a stack of alternating channel layers 130 and sacrificial layers 120 can be formed on a substrate 110, where the channel layers 130 and sacrificial layers 120 can be formed by epitaxial growth on a semiconductor substrate 110. The semiconductor substrate 110 can be, for example, silicon (Si). In various embodiments, the top most layer of the alternating layers in the stack can be a sacrificial layer 120.

In one or more embodiments, the channel layers 130 and sacrificial layers 120 can be made of semiconductor materials, for example, the channel layers 130 can be made of silicon (Si), and the sacrificial layers 120 can be made of silicon-germanium (SiGe), where the sacrificial layers 120 can be selectively removed from between the channel layers 130. For example, the sacrificial layers 120 can be silicon-germanium (SiGe) with about a germanium concentration of about 15 atomic percent (at. %) to about 35 atomic percent (at. %), or about 25 atomic percent (at. %).

In various embodiments, the channel layers 130 can have a thickness in a range of about 3 nanometers (nm) to about 15 nm, or about 4 nm to about 9 nm, although other thicknesses are also contemplated.

In various embodiments, the sacrificial layer 120 can have a thickness in a range of about 6 nanometers (nm) to about 20 nm, or about 8 nm to about 15 nm, although other thicknesses are also contemplated.

In one or more embodiments, a dummy gate structure can be formed on the stack. The dummy gate structure can include a dummy gate dielectric 140, a dummy gate fill 160, and a dummy gate cap 170. In various embodiments, the dummy gate structure can be formed directly on a top most sacrificial layer 120. In various embodiments, the dummy gate structure can be formed directly on a top most channel layer 130. The dummy gate dielectric 140 can be an electrically insulating dielectric material, for example, silicon oxide (SiO). The dummy gate fill 160 can be a selectively etchable material, for example, amorphous silicon (a-Si), amorphous carbon (a-C), amorphous germanium (a-Ge), and combinations thereof. The dummy gate cap 170 can be a dielectric hardmask material, including, but not limited to, silicon oxide (SiO), silicon nitride (SiN), and combinations thereof. The materials can be selectively etchable relative to each other, so the dummy gate fill 160 may be removed without removing the dummy gate dielectric 140 and the dummy gate cap 170, etc.

The A-A cross section shows the dummy gate on the stack. The B-B cross-section (perpendicular to the A-A cross-section) shows the stack and shallow trench isolation (STI) regions 115 formed in the substrate 110, where the shallow trench isolation regions 115 can be formed by an electrically insulating dielectric material, for example, silicon oxide (SiO). The C-C cross-section (perpendicular to the A-A cross-section) also shows the stack and shallow trench isolation regions 115 formed in the substrate 110, where the shallow trench isolation regions 115 can be formed by an electrically insulating dielectric material, for example, silicon oxide (SiO).

The D-D cross-section (parallel to the plane of the substrate) is through a sacrificial layer 120 showing inside the sacrificial layer 120 and adjacent dummy gate structure, including the dummy gate fill 160.

Figure 2:
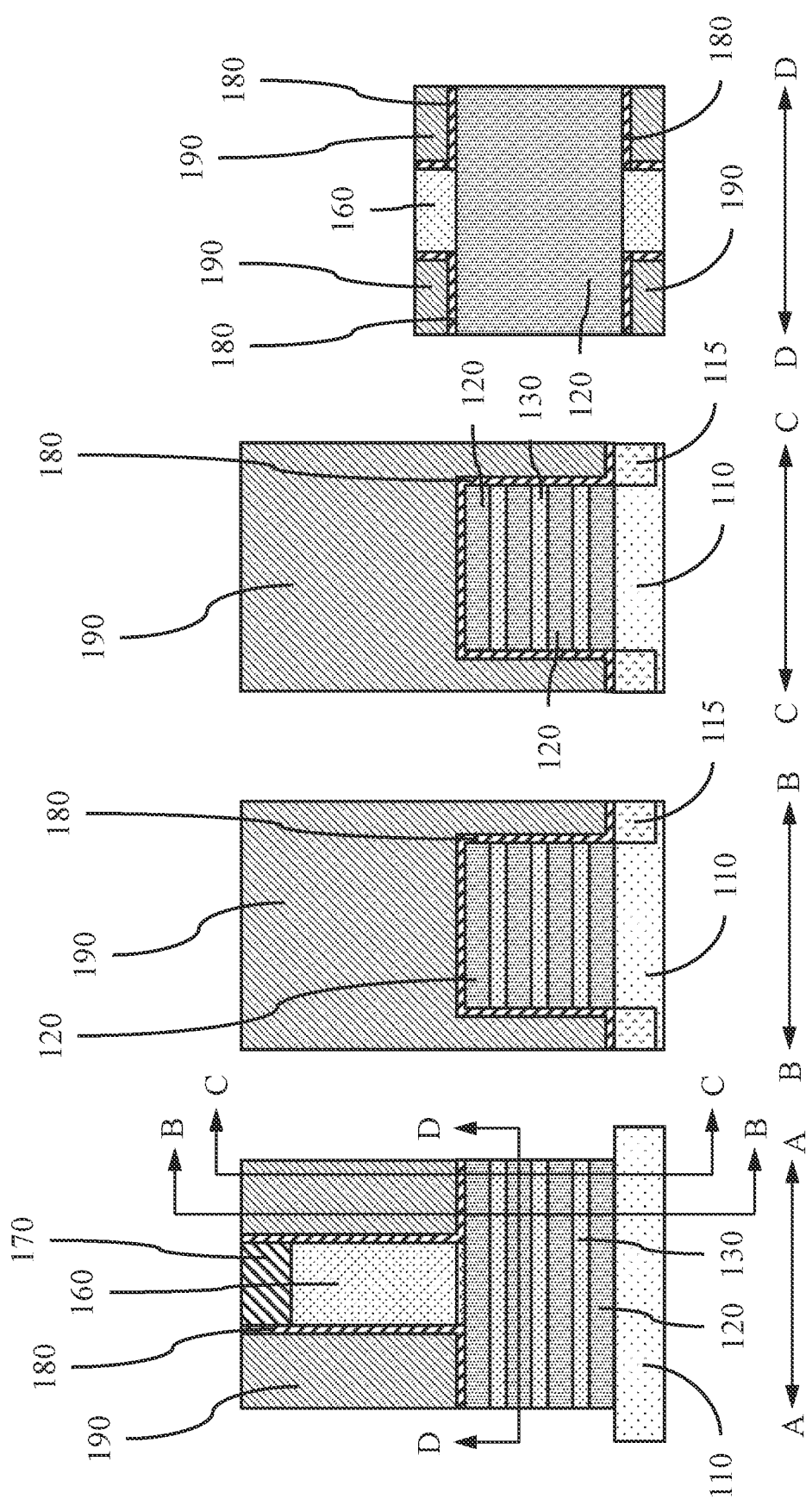
FIG. 2 illustrates multiple cross-sectional views showing an inner spacer liner on the dummy gate structure, and an outer spacer formed on the inner spacer liner, and formation of the source-drain cavity self-aligned to the outer spacer, in accordance with an embodiment of the present invention.

FIG. 2 illustrates multiple cross-sectional views showing an inner spacer liner on the dummy gate structure, and an outer spacer formed on the inner spacer liner, and formation of the source-drain cavity self-aligned to the outer spacer, in accordance with an embodiment of the present invention.

In one or more embodiments, an inner spacer liner 180 can be formed on the dummy gate fill 160 and dummy gate cap 170, where the inner spacer liner 180 can be formed by a conformal deposition, for example, atomic layer deposition (ALD), plasma enhanced ALD (PEALD), plasma enhanced chemical vapor deposition (PECVD), and combinations thereof. In various embodiments, the inner spacer liner 180 can be on the sides of the channel layers 130 and sacrificial layers 120, a top surface of the top most sacrificial layer 120, and on the shallow trench isolation regions 115.

In various embodiments, the inner spacer liner 180 can be an electrically insulating dielectric material, including, but not limited to, silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof.

In various embodiments, the inner spacer liner 180 can have a thickness in a range of about 1 nanometer (nm) to about 4 nm, or about 2 nm to about 3 nm, although other thicknesses are also contemplated.

In one or more embodiments, an outer spacer 190 can be formed on the inner spacer liner 180, where the outer spacer 190 can be formed by a conformal deposition (e.g., ALD, PEALD, CVD, PECVD), and a selective directional etch, for example, a reactive ion etch (RIE) to remove the materials from horizontal surfaces. In various embodiments, the outer spacer 190 can be made of an electrically insulating material, including, but not limited to, silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof.

In one or more embodiments, portions of the channel layers 130 and sacrificial layers 120 extending beyond the outer spacer 190 and dummy gate structure can be removed to form a source/drain cavity.

The A-A cross section shows the inner spacer liner 180 formed on the dummy gate fill 160 and dummy gate cap 170, and the top surface of the top most sacrificial layer 120, where the inner spacer liner 180 has an "L" shape. The outer spacer 190 can be formed on the inner spacer liner 180.

The B-B cross section shows the inner spacer liner 180 on the end faces of the channel layers 130 and sacrificial layers 120, the top surface of the top most sacrificial layer 120, and on the shallow trench isolation regions 115. The outer spacer 190 can be formed over the inner spacer liner 180, where the outer spacer 190 can be on three sides of the channel stack.

The C-C cross section also shows the inner spacer liner 180 on the end faces of the channel layers 130, sacrificial layers 120, top surface of the top most sacrificial layer 120, and the shallow trench isolation regions 115. The outer spacer 190 is over the inner spacer liner 180.

The D-D cross section shows the inner spacer liner 180 along the sides of a sacrificial layer 120, where the inner spacer liner 180 is between the outer spacer 190 and the sacrificial layer 120. A portion of the inner spacer liner 180 can be along each of the four edges of the alternating channel layers 130 and sacrificial layers 120 on a substrate 110. The outer spacer 190 and the inner spacer liner 180 are adjacent to the dummy gate fill 160.

Figure 3:
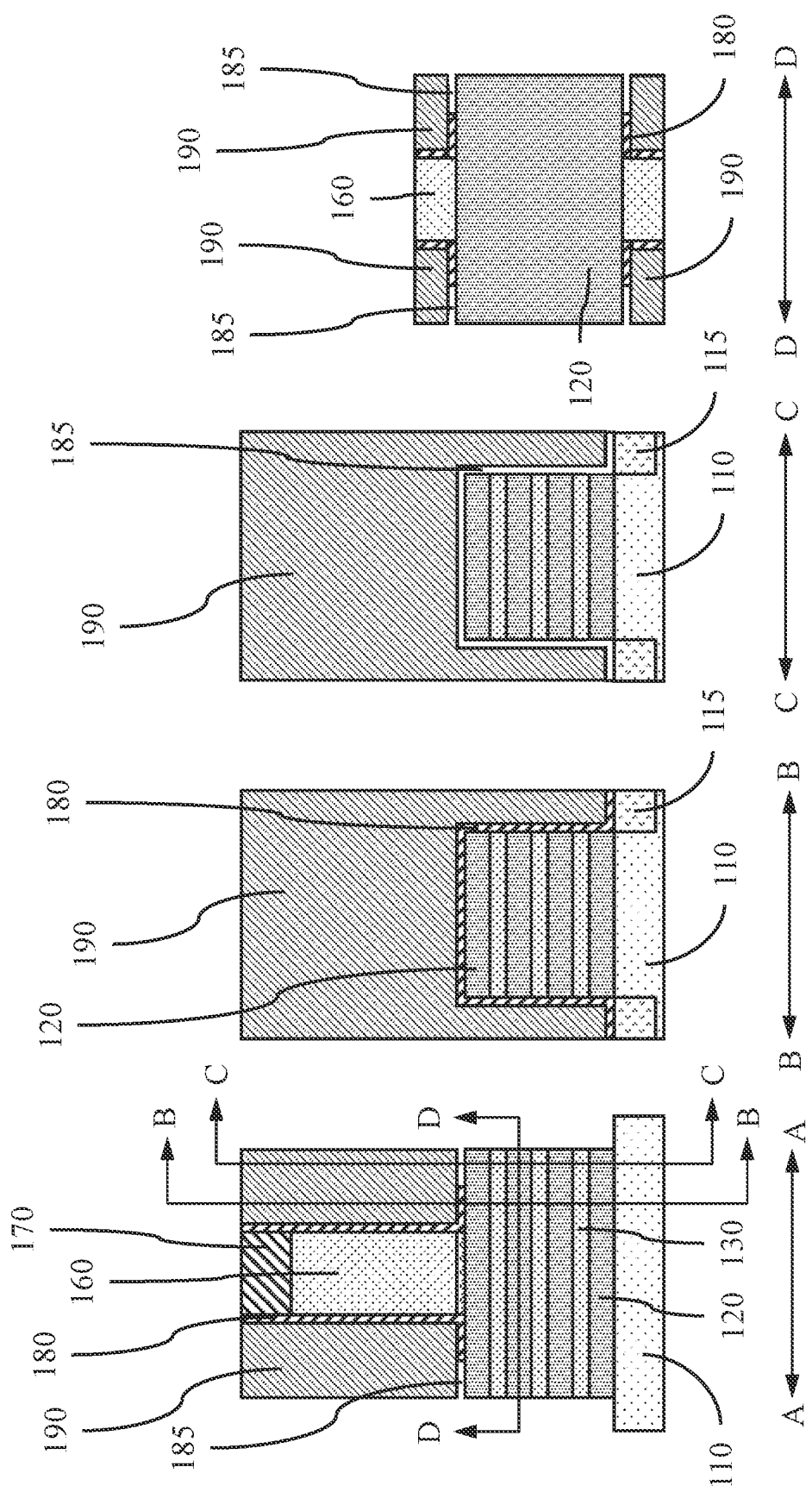
FIG. 3 illustrates multiple cross-sectional views showing the inner spacer liner recessed below the outer spacer, in accordance with an embodiment of the present invention.

FIG. 3 illustrates multiple cross-sectional views showing the inner spacer liner recessed below the outer spacer, in accordance with an embodiment of the present invention.

In one or more embodiments, the inner spacer liner 180 can be recessed using a selective isotropic etch, for example, a dry plasma etch, where a portion of the inner spacer liner 180 below the outer spacer 190 can be removed to form a under spacer cavity 185 beneath a portion of the outer spacer 190 and around the channel stack. The inner spacer liner 180 is selectively and precisely recessed to expose the edge of the sacrificial layer 120 before an inner spacer indentation process.

Recessing the inner spacer liner 180 also can provide additional exposed surface area of the top most sacrificial layer 120 and the edges of the sacrificial layers 120 against the outer spacer 190 that can compensate for the local etch rate differences at the corners and edges during an inner spacer removal/recess process. The etching process used to selectively indent the sacrificial layers can have a lower local etch rate in the regions adjacent to the outer spacer 190.

The A-A cross section shows the inner spacer liner 180 recessed below the outer spacer 190 to form the under spacer cavity 185 between the outer spacer 190 and top most sacrificial layer 120.

The B-B cross section shows the inner spacer liner 180 around the channel stack.

The C-C cross-section shows the under spacer cavity 185 around the channel stack, where the under spacer cavity 185 separates the channel layers 130 and sacrificial layers 120 from the outer spacer 190 towards the end portions of the channel layers 130 and sacrificial layers 120.

The D-D cross-section shows the channels in the four edges of the sacrificial layer 120, and the remaining portions of the inner spacer liner 180 along the four sides of the sacrificial layers 120 adjacent to the dummy gate fill 160.

Figure 4:
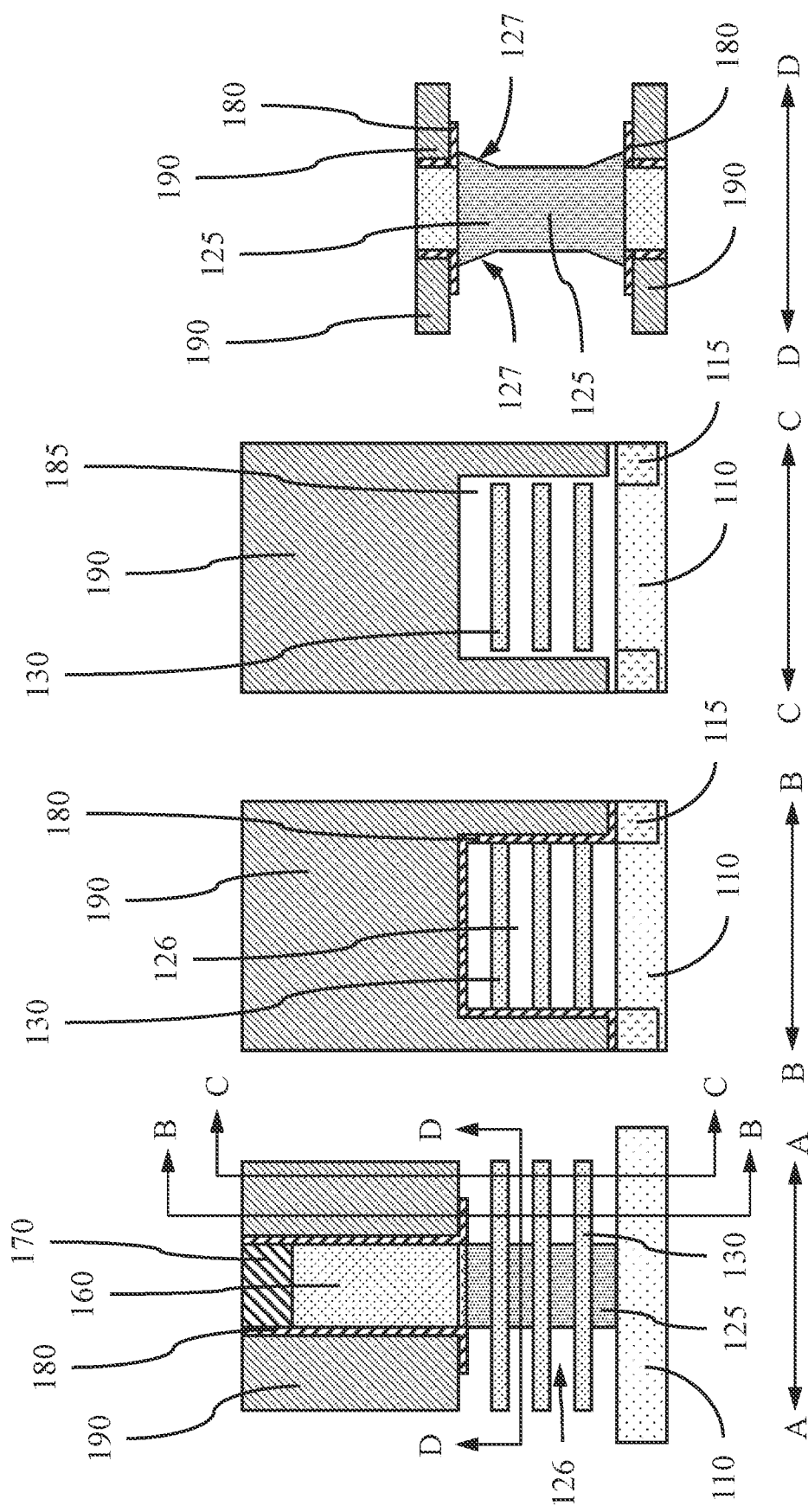
FIG. 4 illustrates multiple cross-sectional views showing the alternating sacrificial layers recessed, in accordance with an embodiment of the present invention.

FIG. 4 illustrates multiple cross-sectional views showing the alternating sacrificial layers recessed, in accordance with an embodiment of the present invention.

In one or more embodiments, the sacrificial layers 120 can be recessed using a selective isotropic etch to form inner spacer cavities 126 adjacent to sacrificial sections 125 between the channel layers 130. The recessing of the sacrificial layers 120 can increase the size of the under spacer cavity 185 where the inner spacer liner 180 was previously removed and extend beneath the outer spacer 190. The sacrificial sections 125 can remain beneath the lower leg of the L-shaped inner spacer liner 180, dummy gate dielectric 140, and dummy gate fill 160. Top and bottom surfaces at opposite ends of the channel layers 130 can be exposed by removing the portions of the sacrificial layers 120, and a portion of the sidewalls of the channel layers 130 can be exposed by the removal of the portion of the lower leg of the L-shaped inner spacer liner 180, which can allow for formation of an inner spacer around four sides of the channel layers 130 at opposite ends of the channel layers 130.

The A-A cross section shows the recessed sacrificial layers 120 and exposed portion of the remaining inner spacer liner 180 with the sacrificial sections 125 beneath the dummy gate fill 160. A bottom most sacrificial section 125 remains between the substrate and the bottom most channel layer 130.

The B-B cross section shows the inner spacer liner 180 around the outside edges of the channel layers 130, and between the shallow trench isolation regions 115 and outer spacer 190. A gap is between the channel layers 130, and between the bottom most channel layer 130 and the substrate 110, where the sacrificial layers 120 have been removed.

The C-C cross-section shows the under spacer cavity 185 around the outside edges of the channel layers 130, and between the shallow trench isolation regions 115 and outer spacer 190, where the inner spacer liner 180 was removed. The opposites ends of the channel layers 130 are exposed on four sides. The outer spacer can be supported at its periphery.

The D-D cross-section shows the uneven etching front 127, where the sacrificial layers 120 have been recessed, and the remaining sacrificial sections 125. A portion of the inner spacer liner 180 is along each section of the outer spacer 190 in four quadrants, and between the projecting portions of the sacrificial sections 125 and the outer spacer 190. A portion of the dummy gate fill 160 is on opposite sides of the sacrificial section 125. The uneven etching front 127 can be minimized along the inner spacer 200 and inner spacer liner 180 by providing increased lateral access for the etchants. It helps recover the intended ideal square shape of the inner spacer indentation, hence the shape of the inner spacer once the cavity is pinched with the inner spacer dielectric. This can minimize the sacrificial section residues on the inner spacer liner sidewalls.

Figure 5:
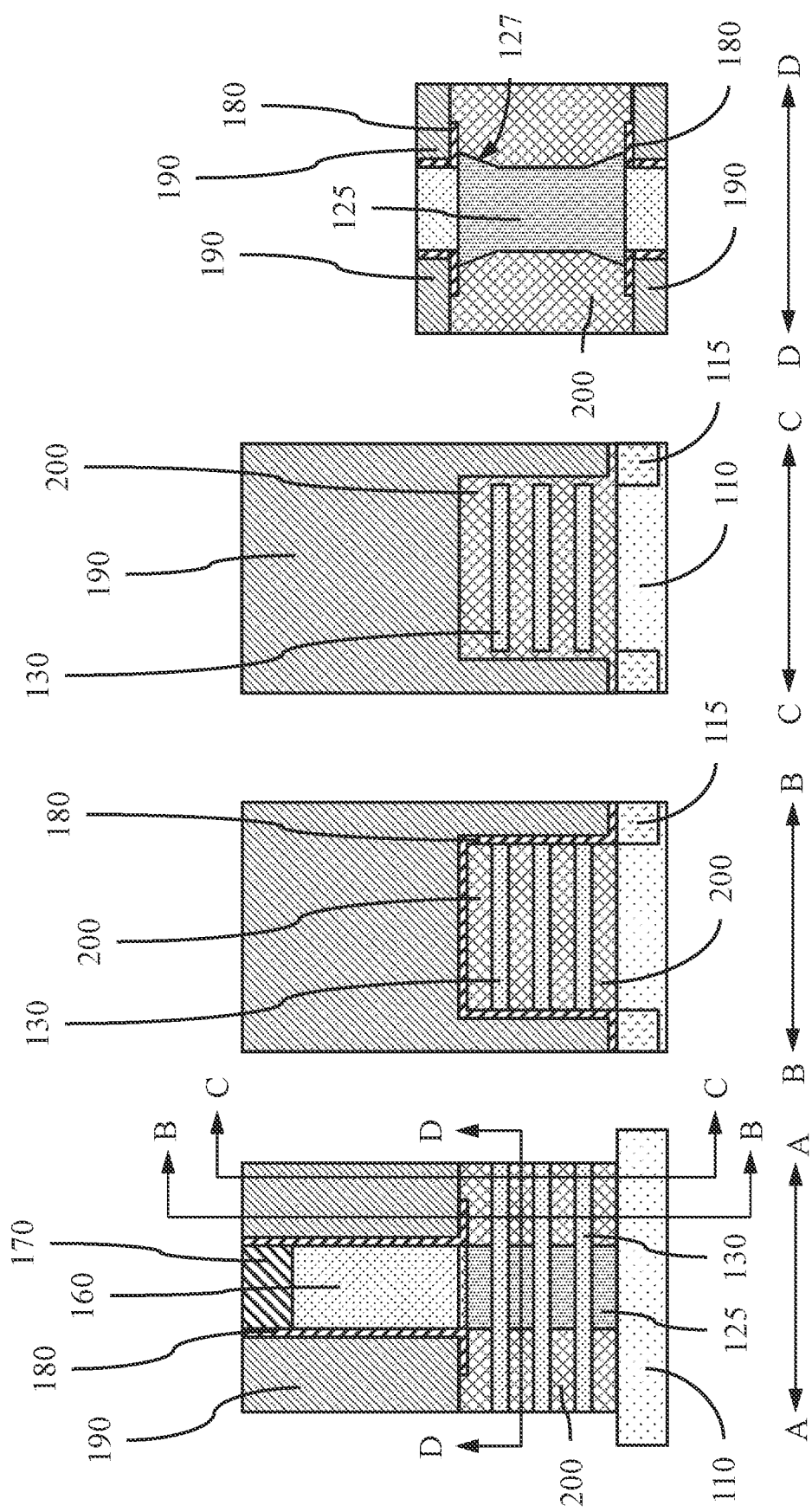
FIG. 5 illustrates multiple cross-sectional views showing an inner spacer formed in the indentations formed by recessing the alternating sacrificial layers, in accordance with an embodiment of the present invention.

FIG. 5 illustrates multiple cross-sectional views showing an inner spacer formed in the indentations formed by recessing the alternating sacrificial layers, in accordance with an embodiment of the present invention.

In one or more embodiments, an inner spacer 200 can be formed in the under spacer cavities 185 and inner spacer cavities 126 between the channel layers 130, where the inner spacer 200 can be formed by a conformal deposition (e.g., ALD, PEALD, CVD, PECVD). A selective isotropic etch (e.g., wet or dry gas phase) can be used to remove portions of the inner spacer 200 that forms on and extends outside of the outer spacer 190. The portion of the lower leg of the L-shaped inner spacer liner 180 can be between a portion of the inner spacer 200 and the outer spacer 190. The inner spacer 200 can separate the channel layers 130 from the outer spacer 190 at opposite ends of the channel layers 130, and a portion of the inner spacer liner 180 can be between a portion of the upper most channel layer and the outer spacer 190. The indent shape of the uneven etching front 127 is more ideal against the outer spacer 190 leading to a thicker effective sealing of the inner spacer 200 against the outer spacer 190 to isolate the gate region from the source-drain regions.

In various embodiments, the inner spacer 200 can be a dielectric material, including, but not limited to, silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof, where the inner spacer 200 can be selectively removed relative to the inner spacer liner 180, outer spacer 190, and dummy gate cap 170.

The A-A cross section shows the inner spacer 200 between the channel layers 130 and between the top most channel layer 130 and the outer spacer 190, where the lower leg of the L-shaped inner spacer liner 180 is between a portion of the outer spacer 190 and a portion of the inner spacer 200. The end faces of the channel layers 130 are exposed.

The B-B cross section shows the inner spacer 200 formed in the inner spacer cavities 126, and the inner spacer liner 180 between the portion of the outer spacer 190 and the portion of the inner spacer 200, and on the shallow trench isolation regions 115. A portion of the inner spacer liner 180 can be between sidewalls of the channel layers 130 and a portion of an outer spacer 190.

The C-C cross section shows the inner spacer 200 wrapped around the four sides of an end portion of each of the channel layers 130, and on the shallow trench isolation regions 115.

The D-D cross-section shows the inner spacer 200 on the uneven etching front 127 of the sacrificial sections 125, the exposed surfaces of the outer spacer 190, and the inner spacer liner 180. The inner spacer liner 180 is along the outer spacer 190.

Figure 6:
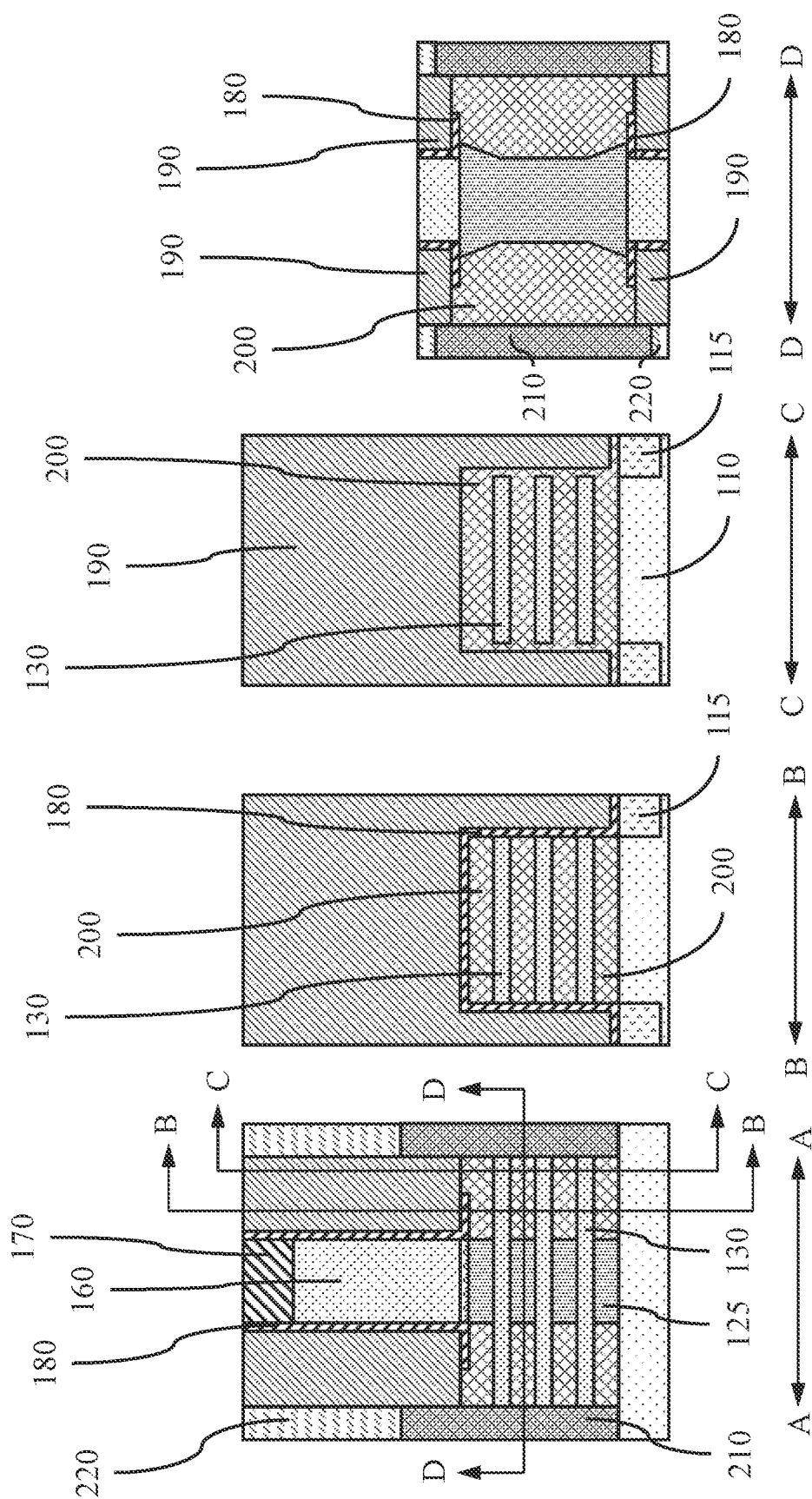
FIG. 6 illustrates multiple cross-sectional views showing source/drains formed on the exposed faces of the channel layers and substrate, and an interlayer dielectric (ILD) layer formed to the source/drains, in accordance with an embodiment of the present invention.

FIG. 6 illustrates multiple cross-sectional views showing source/drains formed on the exposed faces of the channel layers and substrate, and a trench metal contact formed to the source/drains, in accordance with an embodiment of the present invention.

In one or more embodiments, a source/drain 210 can be formed on the exposed end faces of the channel layers 130, where the source/drain 210 can be formed by epitaxial growth from both the exposed substrate surface and the exposed end faces of the channel layers 130. The source/drain 210 can be n-doped, for example, phosphorus (P)), or p-doped, for example, with boron (B), depending on the type of device being formed.

In one or more embodiments, an interlayer dielectric (ILD) layer 220 can be formed to each of the source/drains 210, where the interlayer dielectric (ILD) layer 220 can be formed by a blanket deposition. The interlayer dielectric (ILD) layer 220 can be made of a dielectric material that can protect the source/drains 210.

Figure 7:
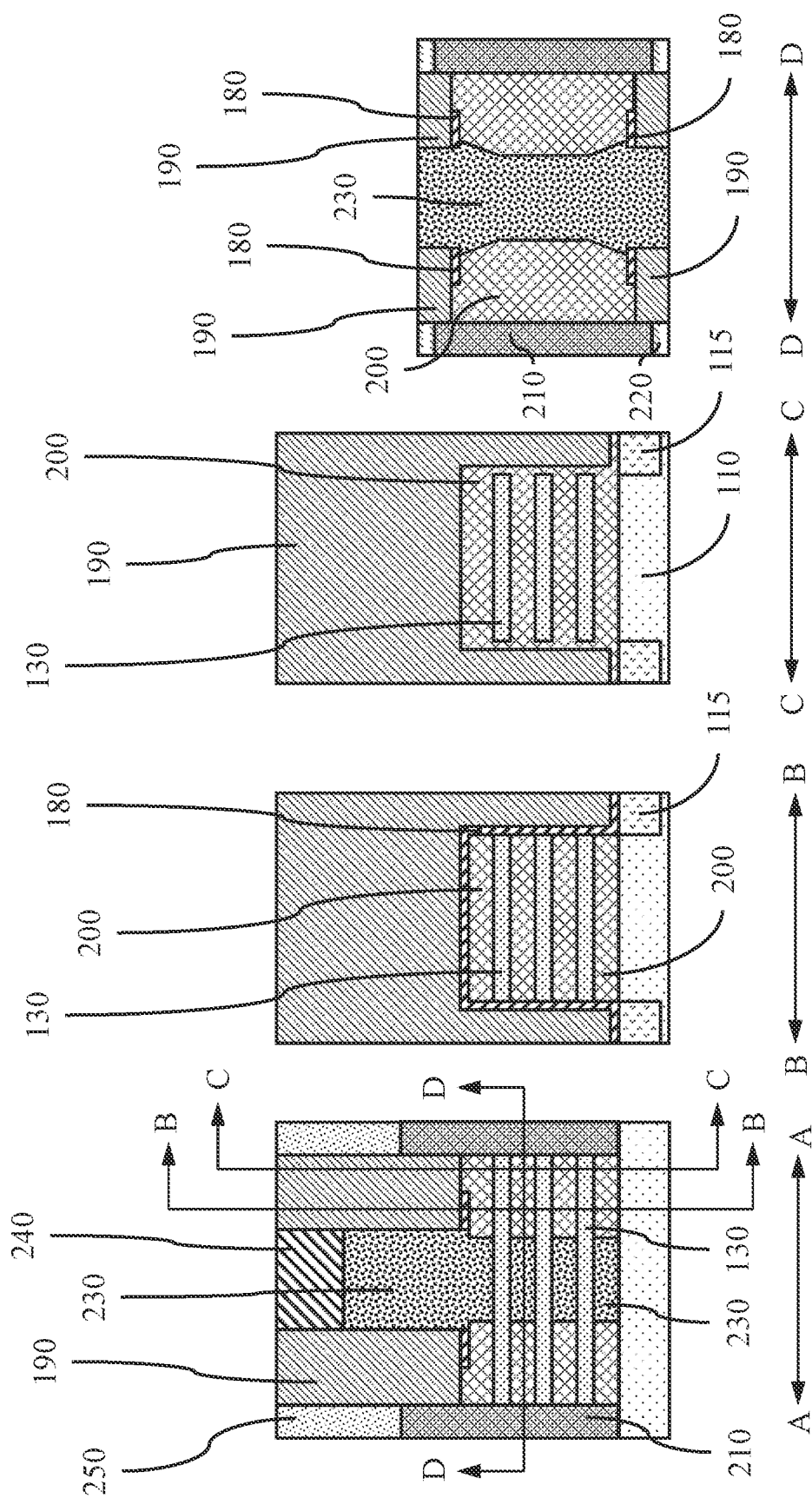
FIG. 7 illustrates multiple cross-sectional views showing replacement of the dummy gate structure with an active gate structure, and formation of a gate cap and trench metal contact over the source/drains, in accordance with an embodiment of the present invention.

FIG. 7 illustrates multiple cross-sectional views showing replacement of the dummy gate structure with an active gate structure, and formation of a gate cap and trench metal contact over the source/drains, in accordance with an embodiment of the present invention.

In one or more embodiments, a replacement metal gate can be formed on the channel layers 130 after removing the sacrificial sections 125.

In one or more embodiments, the dummy gate cap 170 can be removed using a selective isotropic etch to expose the dummy gate fill 160. The dummy gate fill 160 can be removed using another selective isotropic etch to expose the longer upper leg of the L-shaped inner spacer liner 180, and the dummy gate dielectric 140. The exposed portion of the L-shaped inner spacer liner 180 and the dummy gate dielectric 140 can each be removed using selective isotropic etches to expose the inner surfaces of the outer spacer 190, sacrificial sections 125, and an end face of the lower leg of the L-shaped inner spacer liner 180. The sacrificial sections 125 can be removed using a selective isotropic etch to expose the channel layers 130 between the inner spacers 200.

In various embodiments, an active gate structure 230 can be formed on the exposed portions of the channel layers 130, where the an active gate structure 230 can include a gate dielectric layer on the channel layers 130, sidewalls of the inner spacers 200, and the underlying surface of the substrate 110. In various embodiments, a work function material (WFM) layer can be formed on the gate dielectric layer. In various embodiments, a conductive gate fill can be formed on the WFM layer or the gate dielectric layer if the WFM layer is not formed. In various embodiments, a gate cap 240 can be formed on the active gate structure 230, where the gate cap 240 can be an electrically insulating, dielectric material, including, but not limited to, silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof.

The interlayer dielectric (ILD) layer 220 can be removed using a selective etch.

In one or more embodiments, a trench metal contact 250 can be formed to each of the source/drains 210, after forming the active gate structure 230, where the trench metal contact 250 can be formed by a metal deposition. The trench metal contact 250 can be made of a metal that can form a silicide with the source/drains 210.

The A-A cross section shows the active gate structure 230 on the sidewalls of the inner spacer 200, inner spacer liner 180, and on the channel layers 130 and substrate 110.

The B-B cross section shows the inner spacer liner 180 around the inner spacer 200 and channel layers 130, and on the shallow trench isolation regions 115.

The C-C cross section shows the inner spacer 200 wrapped around four sides of an end portion of each of the one or more channel layers 130, and on the shallow trench isolation regions 115.

The D-D cross-section shows the active gate structure 230 on the outer spacer 190, the inner spacer 200, and the inner spacer liner 180. The inner spacer liner 180 is along the outer spacer 190. The deepest portion of the etch front and inner spacer 200 can be parallel with the sides of the outer spacer 190.

Figure 8:
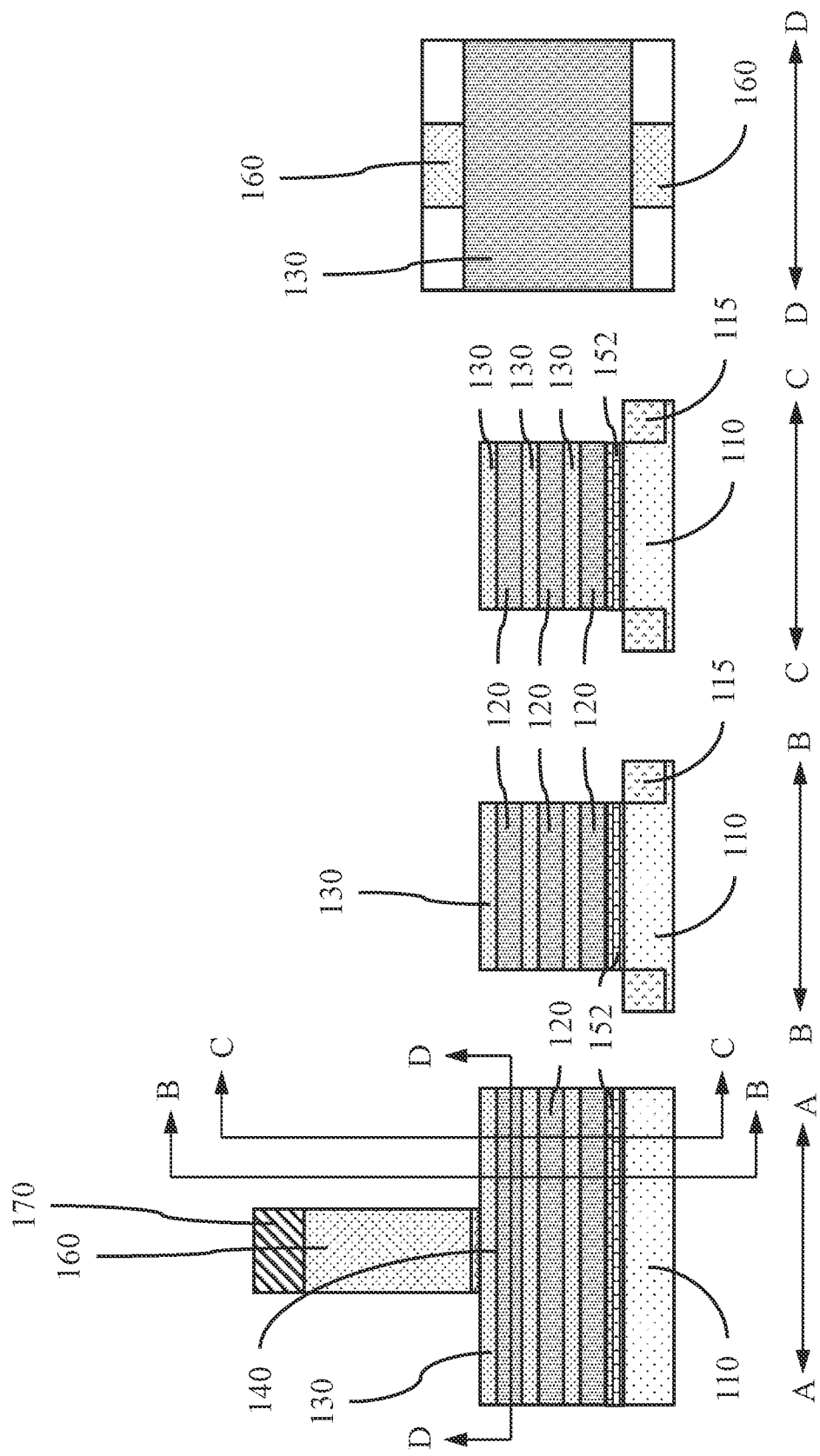
FIG. 8 illustrates multiple cross-sectional views showing a stack of alternating channel layers and sacrificial layers on a substrate without a top sacrificial layer, a sacrificial layer under the stack to form bottom dielectric isolation, and a dummy gate structure on the stack, in accordance with another embodiment of the present invention.

FIG. 8 illustrates multiple cross-sectional views showing a stack of alternating channel layers and sacrificial layers on a substrate without a top sacrificial layer, a sacrificial layer under the stack to form bottom dielectric isolation, and a dummy gate structure on the stack, in accordance with another embodiment of the present invention.

In various embodiments, a stack of alternating channel layers 130 and sacrificial layers 120 can have a channel layer 130 as the top most layer instead of a sacrificial layer 120. The dummy gate structure can be formed directly on the channel layer 130. The bottom most layer can still be a sacrificial layer 120. A sacrificial bottom layer 152 can be formed on the substrate 110 before forming the stack, where the sacrificial bottom layer 152 can be made of silicon-germanium (SiGe) having a different germanium concentration than the sacrificial layers 120 to allow selective removal. In various embodiments, the germanium concentration of the sacrificial bottom layer 152 can be in the range of about 45 at. % to about 75 at. %, or about 60 at. %.

The A-A, B-B, and C-C cross-sections show the channel layer 130 as the top most layer, and the dummy gate structure directly on the channel layer 130.

The D-D cross-section (parallel to the plane of the substrate) is still through a sacrificial layer 120 showing inside the sacrificial layer 120 and adjacent dummy gate structure, including the dummy gate fill 160.

Figure 9:
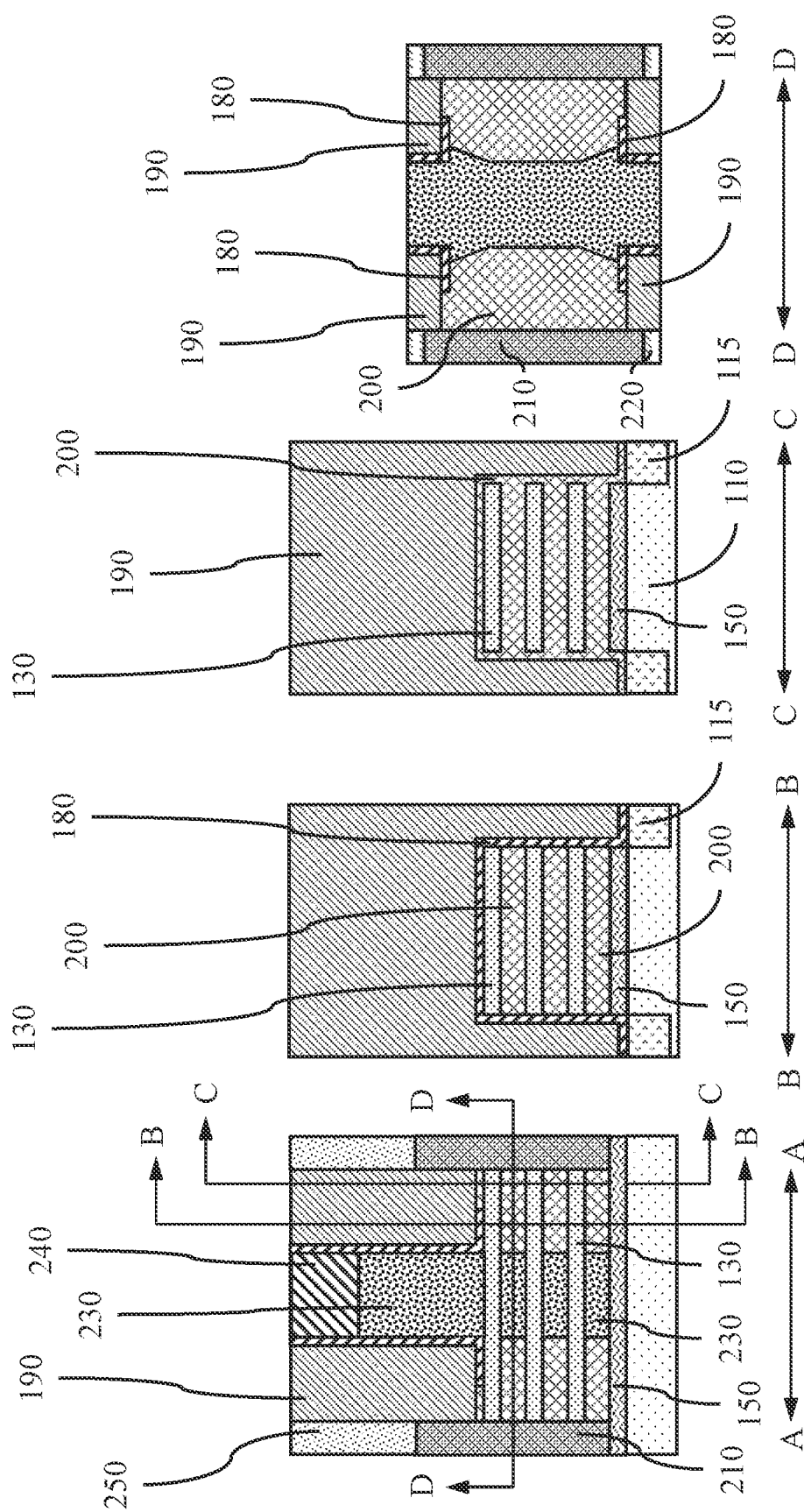
FIG. 9 illustrates multiple cross-sectional views showing the replacement of the dummy gate structure with an active gate structure with the inner liner directly on an upper most channel layer, and formation of a gate cap and trench metal contact over the source/drains, in accordance with another embodiment of the present invention.

FIG. 9 illustrates multiple cross-sectional views showing the replacement of the dummy gate structure with an active gate structure with the inner liner directly on an upper most channel layer, and formation of a gate cap and trench metal contact over the source/drains, in accordance with another embodiment of the present invention.

In various embodiments, the lower leg of the L-shaped inner spacer liner 180 can be directly on the top most channel layer 130. Recessing the lower leg of the L-shaped inner spacer liner 180 can form the under spacer cavity 185 directly between the outer spacer 190 and the top most channel layer 130.

In various embodiments, the sacrificial bottom layer 152 can be removed using a selective, isotropic etch to form a passage beneath the stack. A bottom dielectric isolation layer 150 can be formed on the substrate in the channel beneath the stack, so the bottom dielectric isolation layer 150 is between the source/drains 210 and the substrate 110 and between the active gate structure 230 and the substrate 110. The bottom dielectric isolation layer 150 can be a dielectric material, including, but not limited to, silicon oxide (SiO), silicon nitride (SiN), silicon oxy-nitride (SiON), silicon carbide (SiC), silicon oxy-carbide (SiOC), silicon oxy-carbo-nitride (SiOCN), silicon born-carbo-nitride (SiBCN), aluminum oxide (AlO), titanium oxide (TiO), and combinations thereof.

The A-A cross-sections show the portions of the inner spacer 200 formed in the under spacer cavities 185 and lower leg of the L-shaped inner spacer liner 180 directly on the top most channel layer 130. The inner spacer 200 are between the channel layers 130. The bottom dielectric isolation layer 150 is on the substrate 110.

The B-B cross-sections show the inner spacer liner 180 directly on the top most channel layer 130. The bottom dielectric isolation layer 150 is on the substrate 110. A portion of the inner spacer liner 180 can be between a portion of the upper most channel layer 130 and the outer spacer 190.

The C-C cross-sections show a thinner inner spacer 200 formed between the top most channel layer 130 and the outer spacer 190. The inner spacer 200 still wraps around the four sides of the channel layers 130.

The D-D cross-section shows the active gate structure 230 on the outer spacer 190, the inner spacer 200, and the inner spacer liner 180. The inner spacer liner 180 is along the outer spacer.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as dwell, unless the context clearly indicates otherwise. It will be further understood that the to "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative: terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term below can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of devices and method of fabricating the devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A gate-all-around field effect transistor device, comprising:
   one or more channel layers on a substrate;
   an inner spacer wrapped around four sides of an end portion of each of the one or more channel layers; and
   a portion of an inner spacer liner between a portion of an upper most channel layer and a portion of an outer spacer, the inner spacer filling a vertical space between the one or more channel layers.

2. The gate-all-around field effect transistor device of claim 1, further comprising an active gate structure directly on the portion of the inner spacer on the upper most channel layer, wherein the portion of an inner spacer liner is between the active gate structure and an interface between the inner spacer and the outer spacer.

3. The gate-all-around field effect transistor device of claim 1, wherein a portion of the inner spacer liner is between a portion of the inner spacer on the upper most channel layer and the portion of an outer spacer.

4. The gate-all-around field effect transistor device of claim 1, further comprising source/drains on each end face of the one or more channel layers, wherein the inner spacer and the inner spacer liner separates at least a portion of the source/drains from an active gate structure.

5. The gate-all-around field effect transistor device of claim 4, wherein the source/drains are directly on the substrate.

6. The gate-all-around field effect transistor device of claim 5, further comprising a bottom dielectric isolation layer between the source/drains and the substrate and between the active gate structure and the substrate.

7. The gate-all-around field effect transistor device of claim 6, wherein the inner spacer liner has a thickness in a range of about 1 nanometer (nm) to about 4 nm.

8. The gate-all-around field effect transistor device of claim 7, wherein the inner spacer and the inner spacer liner are each made of an electrically insulating dielectric material selected from the group consisting of silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof.

9. A gate-all-around field effect transistor device, comprising:
   one or more channel layers on a substrate;
   an inner spacer wrapped around four sides of an end portion of each of the one or more channel layers; and
   an inner spacer liner on three sides of a portion of the inner spacer and opposite sidewalls of each of the one or more channel layers, wherein the inner spacer liner is between a portion of an upper most channel layer and a portion of an outer spacer.

10. The gate-all-around field effect transistor device of claim 9, further comprising a bottom dielectric isolation layer between source/drains and the substrate and between an active gate structure and the substrate.

11. The gate-all-around field effect transistor device of claim 10, further comprising source/drains on each of the end faces of the one or more channel layers, wherein the inner spacer and the inner spacer liner separates at least a portion of the source/drains from the active gate structure.

12. The gate-all-around field effect transistor device of claim 11, further comprising an active gate structure directly on the portion of the inner spacer on an upper most channel layer, wherein the portion of an inner spacer liner is between the active gate structure and an interface between the inner spacer and the outer spacer.

13. The gate-all-around field effect transistor device of claim 12, wherein the inner spacer and the inner spacer liner are each made of an electrically insulating dielectric material selected from the group consisting of silicon oxide (SiO), silicon nitride (SiN), silicon oxy-nitride (SiON), silicon carbide (SiC), silicon oxy-carbide (SiOC), silicon oxy-carbo-nitride (SiOCN), silicon boro-carbo-nitride (SiBCN), aluminum oxide (AlO), titanium oxide (TiO), and combinations thereof.

* * * * *